(12) United States Patent
Teng et al.

(10) Patent No.: US 8,987,881 B2
(45) Date of Patent: Mar. 24, 2015

(54) HYBRID LEAD FRAME AND BALL GRID ARRAY PACKAGE

(71) Applicants: Seng Kiong Teng, Shah Alam (MY); Ly Hoon Khoo, Bandar (MY); Navas Khan Oratti Kalandar, Petaling Jaya (MY)

(72) Inventors: Seng Kiong Teng, Shah Alam (MY); Ly Hoon Khoo, Bandar (MY); Navas Khan Oratti Kalandar, Petaling Jaya (MY)

(73) Assignee: Freescale Semiconductor, Inc., Austin, TX (US)

( * ) Notice: Subject to any disclaimer, the term of this patent is extended or adjusted under 35 U.S.C. 154(b) by 15 days.

(21) Appl. No.: 13/938,232

(22) Filed: Jul. 10, 2013

(65) Prior Publication Data

US 2015/0014834 A1    Jan. 15, 2015

(51) Int. Cl.

| | |
|---|---|
| H01L 23/495 | (2006.01) |
| H01L 23/02 | (2006.01) |
| H01L 23/48 | (2006.01) |
| H01L 23/28 | (2006.01) |
| H01L 23/00 | (2006.01) |

(52) U.S. Cl.
CPC ............ *H01L 23/4952* (2013.01); *H01L 24/10* (2013.01); *H01L 24/81* (2013.01); *H01L 2224/81* (2013.01); *H01L 2224/1405* (2013.01)
USPC ............ 257/676; 257/686; 257/738; 257/787

(58) Field of Classification Search
CPC ........... H01L 2224/48091; H01L 2224/48247; H01L 23/4952; H01L 24/10; H01L 24/81; H01L 2224/81; H01L 2224/1405
USPC .......... 257/676, 723, 738, 686, 787, E23.141; 438/109, 458, 123, 124
See application file for complete search history.

(56) References Cited

U.S. PATENT DOCUMENTS

| | | | |
|---|---|---|---|
| 5,835,988 A * | 11/1998 | Ishii | 257/684 |
| 6,652,291 B2 | 11/2003 | Worz | |
| 7,986,043 B2 | 7/2011 | Merilo | |
| 2004/0026773 A1* | 2/2004 | Koon et al. | 257/692 |
| 2004/0100772 A1* | 5/2004 | Chye et al. | 361/702 |
| 2004/0124518 A1* | 7/2004 | Karnezos | 257/686 |
| 2006/0197207 A1* | 9/2006 | Chow et al. | 257/686 |
| 2008/0157321 A1* | 7/2008 | Camacho et al. | 257/686 |
| 2009/0127679 A1* | 5/2009 | Fan et al. | 257/666 |
| 2009/0243069 A1* | 10/2009 | Camacho et al. | 257/686 |
| 2009/0294911 A1* | 12/2009 | Pagaila et al. | 257/620 |

* cited by examiner

*Primary Examiner* — Long K Tran
*Assistant Examiner* — Dzung Tran
(74) *Attorney, Agent, or Firm* — Charles Bergere

(57) ABSTRACT

A semiconductor device includes a first substrate having opposing first and second main surfaces, a first die disposed on the first main surface of the first substrate, a first bond wire coupled to the first die, a first packaging material encapsulating the first die and the first bond wire, and a lead frame disposed on the first main surface of the first substrate and in electrical communication with the first bond wire. At least a portion of the lead frame extends outside of the packaging material. A top package includes first and second main surfaces and an electrical contact on the second main surface. The electrical contact is electrically connected to the lead frame and connects the top package to either the first die and/or external circuitry.

10 Claims, 3 Drawing Sheets

HYBRID LEAD FRAME AND BALL GRID ARRAY PACKAGE

BACKGROUND OF THE INVENTION

The present invention is directed to semiconductor packaging and, more particularly, to a package-on-package structure.

Package-on-package devices are often necessary for applications that must integrate two or more functional devices. Unfortunately, most conventional package-on-package methods require the formations of vias in the molded packages to connect the devices. This can present numerous technological challenges. Such methods are also not suitable for stacking land grid array (LGA) packages, quad flat no leads (QFN) packages, and the like.

It is therefore desirable to provide a package-on-package device that uses a simple, low cost method, and which is suitable for all types of packages.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

In the drawings.

DETAILED DESCRIPTION OF THE INVENTION

Figure 1:
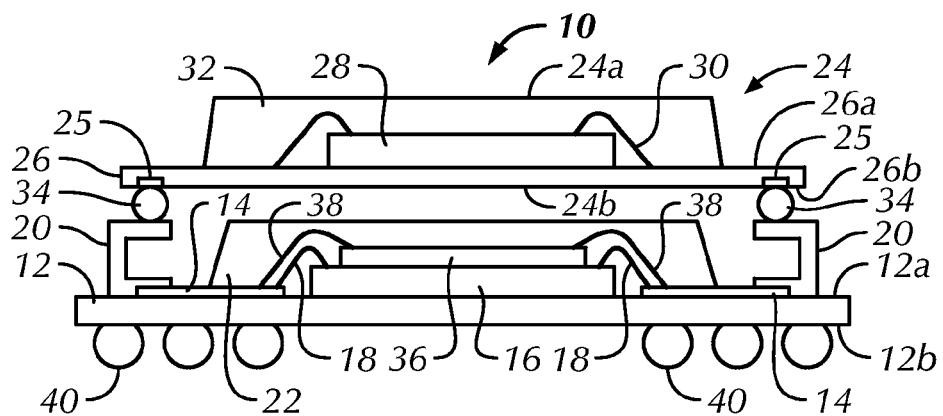
FIG. 1 is a cross-sectional side elevational view of a semiconductor package-on-package device in accordance with a first embodiment of the invention.

Referring to the drawings, wherein the same reference numerals are used to designate the same components throughout the several figures, there is shown in FIG. 1 a first embodiment of a semiconductor package-on-package device 10 in accordance with the invention. The device 10 includes a first substrate 12 having opposing first and second main surfaces 12a, 12b. The first substrate 12 is preferably formed of polymer-based materials, such as fiberglass, polyimide, or the like, although other types of materials may be used as well.

One or more electrical traces 14 may be formed on the first substrate 12, and may be made from copper or the like. The electrical traces 14 are shown in FIG. 1 as being exposed at the first main surface 12a of the first substrate 12. However, the electrical traces 14 may also or alternatively be formed on the second main surface 12b, or may be embedded or partially embedded in the first substrate 12. The substrate 12 may also be coated with a protective layer (not shown), such as a lacquer-like layer of polymer that can be used to provide a permanent protective coating for the electrical traces 14 and the rest of the main substrate surfaces 12a, 12b. The coating may be removed from desired locations of the electrical traces 14 in subsequent processing steps when coupling other components thereto.

A first semiconductor die 16 is disposed on the first main surface 12a of the substrate 12 and is typically in the form of an integrated circuit (IC) or the like. The first semiconductor die 16 is preferably formed from any semiconductor material or combinations of materials, such as gallium arsenide, silicon germanium, silicon-on-insulator (SOI), silicon, monocrystalline silicon, the like, and combinations of the above. The first semiconductor die 16 is preferably attached to the first main surface 12a of the first substrate 12 by epoxy or a like adhesive, although other methods of attachment, such as solder mounts, welding, mechanical or other fasteners, or the like, may be used as well.

The first semiconductor die 16 is preferably electrically connected to the electrical traces 14 using one or more first bond wires 18. The first bond wires 18 are preferably in the form of gold wires attached via a conventional wire bonding process, although other materials and attachment techniques may be used. However, other electrical interconnectors may be used in place of the first bond wires 18, such as solder balls, conductive pads, through wafer vias, or the like, which would allow the physical mounting of the first semiconductor die 16 on the first main surface 12a of the first substrate 12 to also serve as the electrical connection.

The first semiconductor die 16 and the first bond wires 18, as well as at least a portion of each of the corresponding electrical traces 14, are preferably embedded in a first encapsulant or packaging material 22, such as a mold compound, as is conventionally known. The first packaging material 22 may be made from a ceramic material, a polymeric material, or the like. The first packaging material 22 may alternatively be a liquid dispensed glob top material, such as a polymeric epoxy, or the like.

One or more lead frames 20 are also preferably disposed on the first main surface 12a of the first substrate 12. The one or more lead frames 20 are preferably made from a conductive material such as copper, copper alloy, gold, or the like, or may utilize pre-plated frame (PPF) technology such as tin-palladium, tin-bismuth, or the like. The lead frames 20 are in electrical contact with one or more of the first bond wires 18. In the embodiment of FIG. 1, the electrical contact is made by coupling the lead frames 20 to one or more of the electrical traces 14, preferably by soldering or the like.

In FIG. 1, the lead frames 20 are generally U-shaped (in cross-section), with each having one portion lying along the first main surface 12a of the first substrate 12 connected to the respective electrical trace 14 and an adjacent portion extending away from the first main surface 12a of the first substrate 12. A final portion of each of the lead frames 20 extends parallel to and spaced from the first main surface 12a of the first substrate 12 for connection to additional elements, as will be described in more detail below. However, other shapes and orientations of the lead frame 20 can also be used in accordance with the invention. As shown in FIG. 1, the lead frames 20 lie entirely outside of the first packaging material 22, although it is contemplated that in some embodiments, portions of the lead frames 20 may be embedded within the first packaging material 22 (see e.g., FIG. 4).

A top package 24 is provided for connection to the first semiconductor die 16. The top package 24 includes opposing first and second main surfaces 24a, 24b, with one or more electrical contacts 25 located at the second main surface 24b thereof. In FIG. 1, the top package 24 includes a second substrate 26 having opposing first and second main surfaces 26a, 26b. The second substrate 26 is preferably formed from the same or similar materials as the first substrate 12. Much like the first substrate 12, the second substrate 26 has a second semiconductor die 28 disposed on the first main surface 26a thereof, and one or more second bond wires 30 are coupled to the second semiconductor die 28. A second encapsulant or packaging material 32 preferably encapsulates the second semiconductor die 28 and the second bond wires 30.

In the embodiment of FIG. 1, the second main surface 26b of the second substrate 26 serves as the second main surface 24b of the top package 24. Therefore, the one or more electrical contacts 25 are preferably located on the second main surface 26b of the second substrate 26. The second bond wires 30 are in electrical communication with the one or more electrical contacts 25 through traces, vias, or the like (not shown) extending through or around the second substrate 26. In the embodiment of FIG. 1, the electrical contacts 25 are attached to solder balls 34 in a conventional ball grid array (BGA) or like manner. The solder balls 34 serve to electrically connect the electrical contacts 25 with one or more lead frames 20. As a result, the first and second semiconductor dies 16, 28 are in electrical communication with one another through the one or more lead frames 20.

In the particular embodiment of FIG. 1, a third semiconductor die 36 may be stacked on the first semiconductor die 16 using a non-conductive adhesive, epoxy, or the like. Third wire bonds 38 couple the third semiconductor die 36 to one or more of the electrical traces 14 on the first main surface 12a of the first substrate 12. Thus, the one or more lead frames 20 can be used to couple multiple semiconductor dies 16, 36 encapsulated in the first packaging material 22 to a top package 24.

It is preferred that the first substrate 12 is of the BGA, tape BGA (TBGA), mold array process-BGA (MAPBGA), plastic BGA (PBGA) type, or the like. Accordingly, a plurality of solder balls 40 may be located on the second main surface 12b of the first substrate 12 for providing a path for electrical signals between the device 10 and a printed circuit board (PCB) or other device (not shown) to which the device 10 is to be electrically coupled via the solder balls 40.

Figure 2:
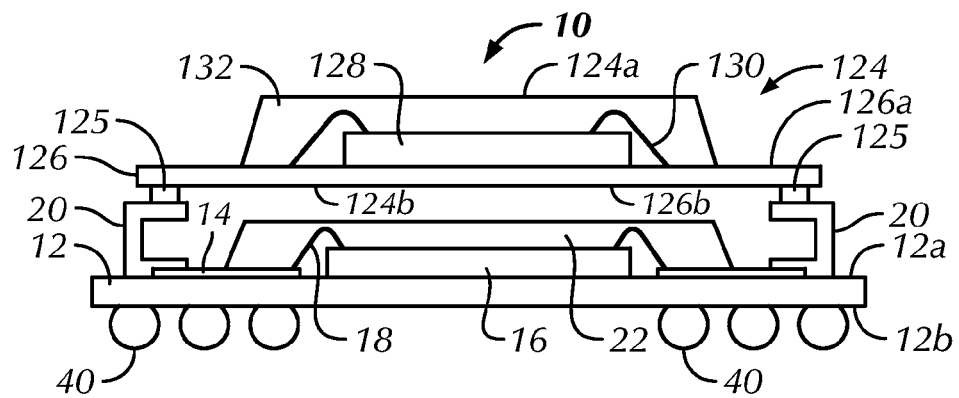
FIG. 2 is a cross-sectional side elevational view of a semiconductor package-on-package device in accordance with a second embodiment of the invention.

FIG. 2 shows a second embodiment of the invention wherein the top package 124 is a leadless type package, such as a land grid array (LGA), quad flat no leads (QFN), or the like. In the embodiment of FIG. 2, the electrical contacts 125 on the second main surface 124b of the top package 124 may be directly coupled to the one or more lead frames 20 by, for example, soldering or other welding methods.

Figure 3:
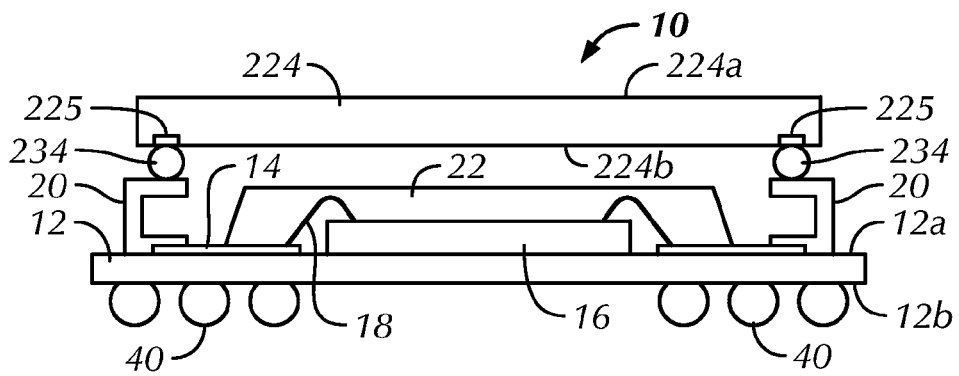
FIG. 3 is a cross-sectional side elevational view of a semiconductor package-on-package device in accordance with a third embodiment of the invention.

FIG. 3 shows a third embodiment of the invention wherein the top package 224 is a wafer-level package (WLP). The electrical contacts 225 are shown as being electrically connected to the lead frames 20 using solder balls 234, similar to the first embodiment shown in FIG. 1. Various methods of connecting the lead frames 20 to the electrical contacts 25, 125, 225 of the top packages 24, 124, 224 may be used in keeping with the invention.

Figure 4:
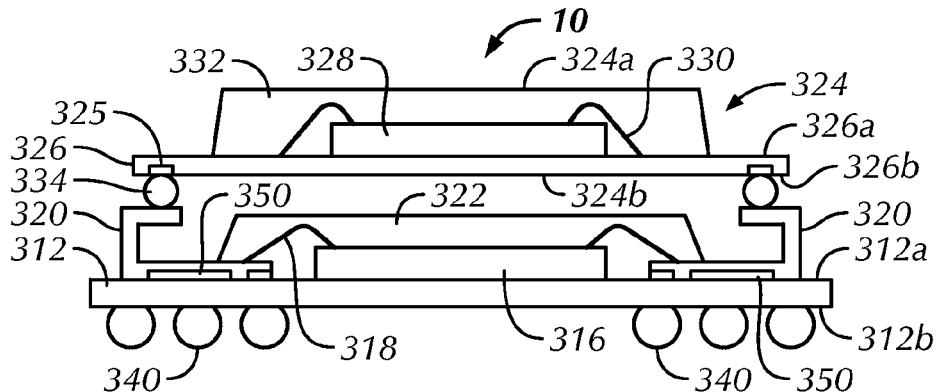
FIG. 4 is a cross-sectional side elevational view of a semiconductor package-on-package device in accordance with a fourth embodiment of the invention.

FIG. 4 shows a fourth embodiment of the invention which includes several differences from the first three embodiments. For example, the lead frames 320 are preferably attached to the first main surface 312a of the first substrate 312 using an adhesive 350 or other epoxy, and may or may not be in electrical communication with the electrical traces (not shown). Rather, the first semiconductor die 316 is preferably electrically connected to the lead frames 320 via a direct coupling of the bond wires 318 to the lead frames 320. In this embodiment, the first packaging material 322 embeds the portions of the lead frames 320 coupled to the bond wires 318.

Figure 5:
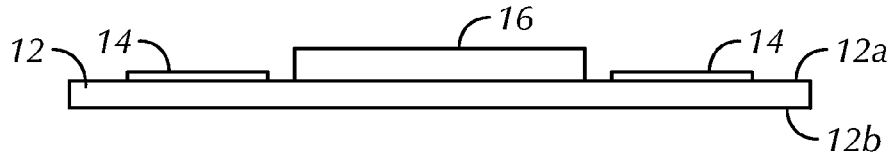
FIG. 5 is a cross-sectional side elevational view of a substrate and semiconductor die disposed thereon for forming the semiconductor package-on-package device shown in any of FIGS. 1-3.

Referring now to FIGS. 5-8, an exemplary method for manufacturing a package 10 in accordance with an embodiment of the invention will now be described. The first substrate 12 is provided with electrical traces 14 formed thereon. The first semiconductor die 16 is preferably singulated from a wafer (not shown) prior to bonding with the first substrate 12. The first semiconductor die 16 and/or a portion of the first main surface 12a of the first substrate 12 may be coated with the epoxy or adhesive prior to bonding. Following the bonding any plasma etching or additional processing necessary for preparation of the first semiconductor die 16 may be performed (FIG. 5).

Figure 6:
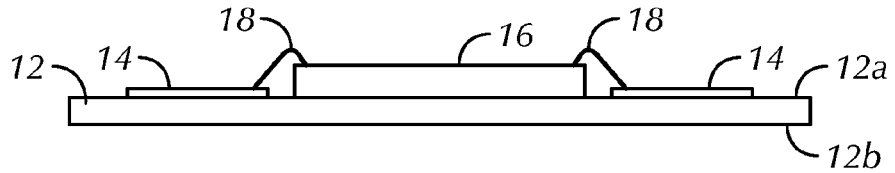
FIG. 6 is a cross-sectional side elevational view of the structure of FIG. 5 following a wire bonding step.
Figure 7:
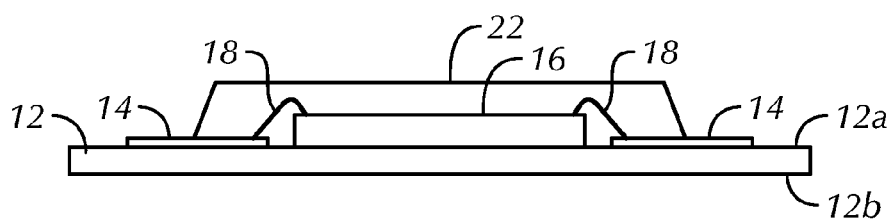
FIG. 7 is a cross-sectional side elevational view of the structure of FIG. 6 following encapsulation of the semiconductor die and bond wires.
Figure 8:
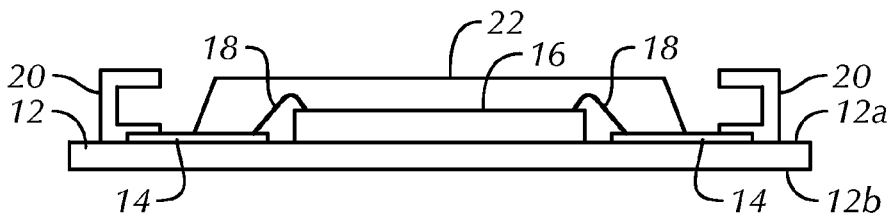
FIG. 8 is a cross-sectional side elevational view of the structure of FIG. 7 following attachment of lead frames.

The first bond wires 18 are then bonded to pads or leads (not shown) of the first semiconductor die 16 and the electrical traces 14 on the first main surface 12a of the first substrate 12 using conventional wire bonding techniques (FIG. 6). The first packaging material 22 is thereafter applied in a conventional molding process to embed the first semiconductor die 16 and the first bond wires 18 (FIG. 7). If the first substrate 12 has not already been singulated, this step may be performed after the molding process.

Once the first substrate 12 is singulated and encapsulated or covered with the first packaging material 22, the lead frames 20 may be attached to the electrical traces 14 (FIG. 8), preferably via a soldering process, although other techniques for forming an electrical connection with the electrical traces 14 can be used as well. Preferably, the lead frames 20 are initially connected to respective linking bars (not shown) and remain so during attachment to the first substrate 12. Following attachment, the lead frames 20 are severed and the linking bars are removed, and the lead frames 20 may thereafter be bent into the "U" shape shown in the drawings, or other like orientations. Once the lead frames 20 are secured, any of the top packages 24, 124, 224 shown in FIGS. 1-3, which can be prepared prior to, simultaneously with, or subsequent to the processing of the first substrate 12, may be attached to the lead frames 20 by coupling the respective electrical contacts 25, 125, 225 to the lead frames 20, preferably by a soldering process and flux cleaning.

The solder balls 40 to form the BGA on the second main surface 12b of the first substrate 12 are preferably attached following attachment of the top package 24, 124, 224.

To manufacture the embodiment shown in FIG. 1, preferably the third semiconductor die 36 is attached to the first semiconductor die 16, using conventional techniques, and the third bond wires 38 are connected to the electrical traces 14 all prior to the molding process in FIG. 7. However, the molding process may be partially performed at various earlier stages depending on the layout of the components on the first substrate 12.

Figure 9:
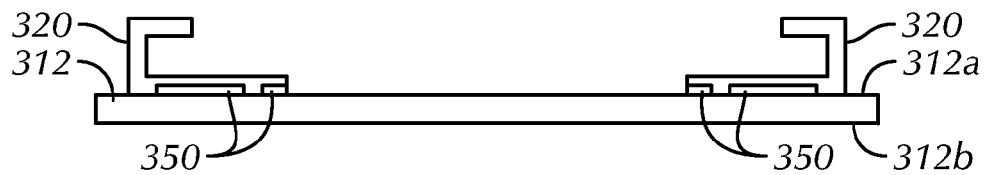
FIG. 9 is a cross-sectional side elevational view of a substrate and lead frames disposed thereon for forming the semiconductor package-on-package device shown in FIG. 4.
Figure 10:
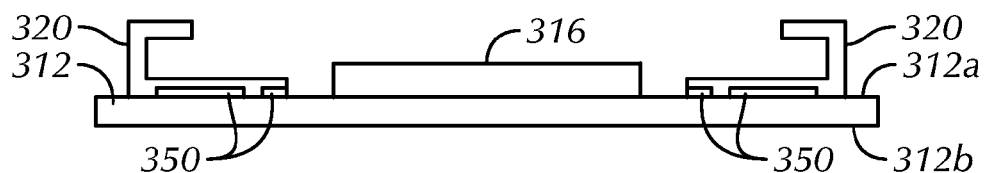
FIG. 10 is a cross-sectional side elevational view of the structure of FIG. 9 following attachment of a semiconductor die to the substrate.

Referring now to FIGS. 9-12, an exemplary method for forming the package according to the fourth embodiment shown in FIG. 4 will be described. The first substrate 312 is provided and the lead frames 320 are attached to the first main surface 312a thereof using the adhesive 350 (FIG. 9). The first semiconductor die 316 is preferably singulated from a wafer (not shown) prior to bonding with the first substrate 312 (FIG. 10). The first semiconductor die 316 and/or a portion of the first main surface 312a of the first substrate 312 may be coated with the epoxy or adhesive prior to bonding. Following the bonding any plasma etching or additional processing necessary for preparation of the first semiconductor die 316 may be performed.

Figure 11:
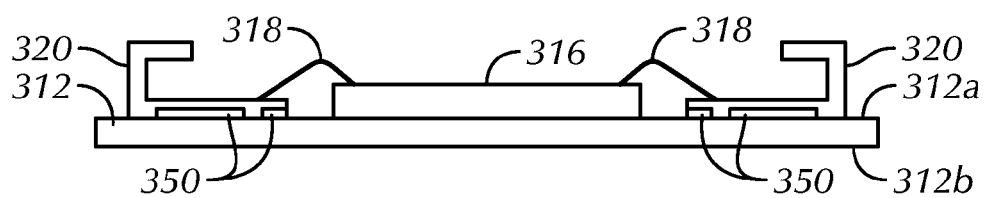
FIG. 11 is a cross-sectional side elevational view of the structure of FIG. 10 following a wire bonding step.
Figure 12:
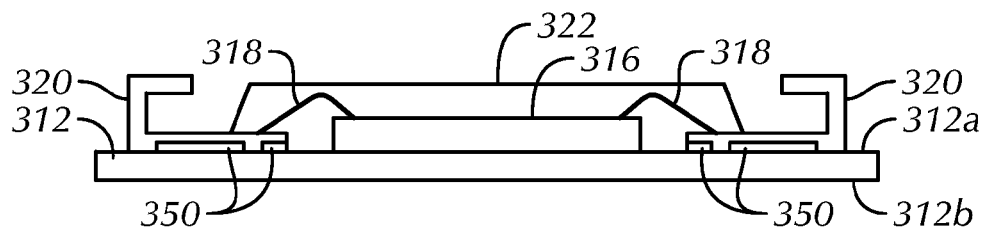
FIG. 12 is a cross-sectional side elevational view of the structure of FIG. 11 following encapsulation of the semiconductor die and bond wires.

The first bond wires 318 are then bonded to pads or leads (not shown) of the first semiconductor die 316 and the lead frames 320 on the first main surface 312a of the first substrate 312 using conventional wire bonding techniques (FIG. 11). The first packaging material 322 is thereafter applied in a conventional molding process to embed or encapsulate the first semiconductor die 316, the first bond wires 318, and the portions of the lead frames 320 to which the first bond wires 318 are attached (FIG. 12). At least a portion of each of the lead frames 320 is left exposed for coupling to the top package 324. If the lead frames 320 are not pre-plated, a plating process may be undertaken to prepare the lead frames 320 for attachment. Trimming and forming of the lead frames 320 may also be performed as necessary. For example, as described above, the lead frames 320 may be separated from respective connecting linking bars (not shown) following attachment to the first substrate 312, and may be subsequently trimmed and shaped.

The top package 324 shown in FIG. 4, which can be prepared prior to, simultaneously with, or subsequent to the processing of the first substrate 312, may be attached to the lead frames 320 by coupling the respective electrical contacts 325 to the lead frames 320, preferably by a soldering process and flux cleaning. The top package 324 may be similar to the top package 24 shown in FIG. 1, with the components numbered similarly. However, it is contemplated that any of the top packages 24, 124, 224, 324 disclosed herein, or other configurations thereof, may be used in accordance with the invention.

The solder balls 340 to form the BGA on the second main surface 312b of the first substrate 312 are preferably attached following attachment of the top package 324.

In the foregoing specification, the invention has been described with reference to specific examples of embodiments of the invention. It will, however, be evident that various modifications and changes may be made thereto without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A semiconductor device comprising:
 a first substrate having opposing first and second main surfaces;
 a first die disposed on the first main surface of the first substrate;
 a first bond wire coupled to the first die;
 a first packaging material encapsulating the first die and the first bond wire;
 a lead frame disposed on the first main surface of the first substrate and in electrical communication with the first bond wire, at least a portion of the lead frame extending outside of the first packaging material, wherein the lead frame is U-shaped and comprises a first portion lying along the first main surface of the first substrate, an adjacent second portion extending vertically away from the first main surface of the first substrate, and a third portion extending parallel to and spaced from the first main surface of the first substrate; and
 a top package having first and second main surfaces and an electrical contact on the second main surface, the electrical contact being electrically connected to the third portion of the lead frame.

2. The semiconductor device of claim 1, wherein the first substrate includes an electrical trace on the first main surface thereof, the first bond wire and the lead frame being coupled to the electrical trace.

3. The semiconductor device of claim 1, wherein the lead frame is coupled to the electrical contact of the top package by a solder ball.

4. The semiconductor device of claim 1, wherein the top package is a wafer-level package.

5. The semiconductor device of claim 1, wherein the top package comprises
 a second substrate having opposing first and second main surfaces, the electrical contact being disposed on the second main surface of the second substrate;
 a second die disposed on the first main surface of the second substrate;
 a second bond wire coupled to the second die and in electrical communication with the electrical contact; and
 a second packaging material encapsulating the second die and the second bond wire.

6. The semiconductor device of claim 1, wherein the lead frame is soldered directly to the electrical contact of the top package.

7. The semiconductor device of claim 1, wherein the first wire bond is directly coupled to the lead frame.

8. The semiconductor device of claim 1, wherein the lead frame is located entirely outside of the packaging material.

9. The semiconductor device of claim 1, wherein the lead frame is attached to the first main surface of the first substrate by an adhesive.

10. The semiconductor device of claim 1, further comprising a second die stacked on the first die; and
   a second bond wire coupled to the second die and in electrical communication with the lead frame.

\* \* \* \* \*